United States Patent
Margalit (10) Patent No.: US 9,077,149 B2
(45) Date of Patent: Jul. 7, 2015

(54) MODULATION OF VERTICAL CAVITY LASER (VCSEL) FOR ENHANCED RANGE OF MULTI-MODAL FIBER COMMUNICATION

(71) Applicant: Empire Technology Development LLC, Wilmington, DE (US)

(72) Inventor: Mordehai Margalit, Zichron Yagov (IL)

(73) Assignee: Empire Technology Development LLC, Wilmington, DE (US)

( * ) Notice: Subject to any disclaimer, the term of this patent is extended or adjusted under 35 U.S.C. 154(b) by 16 days.

(21) Appl. No.: 13/977,482

(22) PCT Filed: Dec. 27, 2012

(86) PCT No.: PCT/US2012/071868
§ 371 (c)(1),
(2) Date: Jun. 28, 2013

(87) PCT Pub. No.: WO2014/105029
PCT Pub. Date: Jul. 3, 2014

(65) Prior Publication Data
US 2014/0185636 A1      Jul. 3, 2014

(51) Int. Cl.
*H01S 3/10*     (2006.01)
*H01S 3/091*    (2006.01)
*H01S 5/00*     (2006.01)
*H01S 5/183*    (2006.01)
(Continued)

(52) U.S. Cl.
CPC ......... *H01S 5/18302* (2013.01); *H01S 5/18361* (2013.01); *H01S 5/041* (2013.01); *H01S 5/0607* (2013.01); *H01S 5/0614* (2013.01); *H01S 5/06206* (2013.01)

(58) Field of Classification Search
CPC . H01S 5/06246; H01S 5/183; H01S 5/18302; H01S 5/18361; H01S 5/041
USPC ............................. 372/12, 26, 28, 50.124, 70
See application file for complete search history.

(56) References Cited

U.S. PATENT DOCUMENTS 5,468,656 A    11/1995  Shieh et al.
6,879,611 B1    4/2005  Johansson et al.
(Continued)

FOREIGN PATENT DOCUMENTS

JP    2004247730 A    9/2004
WO    2012155911 A1   11/2012

OTHER PUBLICATIONS

"Vertical-cavity surface-emitting laser", http://en.wikipedia.org/wiki/Vertical-cavity_surface-emitting_laser, created on Mar. 21, 2006.
(Continued)

*Primary Examiner* — Armando Rodriguez
(74) *Attorney, Agent, or Firm* — Turk IP Law, LLC (57) ABSTRACT

Technologies are described for enabling VCSELs to transmit phase or frequency modulated signals, which may have a substantially smaller transmission bandwidth and are more robust to transmission in a highly dispersive media such as multi-mode fibers. By applying an electric, magnetic, or electromagnetic field across one or more reflector layers of the VCSEL, a refractive index of the reflector layer(s) may be modified. The VCSEL may then be excited and the laser beam generated by the VCSEL phase-modulated by modifying a magnitude of the applied field.

28 Claims, 7 Drawing Sheets

(51) Int. Cl.
*H01S 5/06* (2006.01)
*H01S 5/062* (2006.01)
*H01S 5/04* (2006.01)

(56) References Cited

U.S. PATENT DOCUMENTS

| | | |
|---|---|---|
| 7,295,589 B2 | 11/2007 | Peters et al. |
| 7,580,595 B1 | 8/2009 | Bimberg et al. |
| 7,881,357 B2 | 2/2011 | Takahashi |
| 2004/0160997 A1 | 8/2004 | Peters et al. |
| 2005/0265412 A1 | 12/2005 | Ueki |
| 2007/0291808 A1 | 12/2007 | Ledentsov et al. |
| 2012/0114005 A1 | 5/2012 | Inao et al. |

OTHER PUBLICATIONS

Berthold joe, "OIF Work on 100G Ultra Long Haul DWDM", Proceeding's of OFC/NFOEC 2009, San Diego, CA, Presented on Mar. 26, 2009.

International Search Report and Written Opinion for PCT/US2012/071866 filed Dec. 27, 2012, mailed on Mar. 8, 2013.

MODULATION OF VERTICAL CAVITY LASER (VCSEL) FOR ENHANCED RANGE OF MULTI-MODAL FIBER COMMUNICATION

This Application is the National Stage filing under 35 U.S.C. §371 of PCT Application Ser. No. PCT/US 12/71868 filed on Dec. 27, 2012. The disclosure of the PCT Application is hereby incorporated by reference in its entirety.

BACKGROUND

Unless otherwise indicated herein, the materials described in this section are not prior art to the claims in this application and are not admitted to be prior art by inclusion in this section.

Optical fibers are widely used in fiber-optic communications, which may permit transmission over longer distances and at higher bandwidths (data rates) than other forms of communication. In addition to light range frequencies providing substantially wider bandwidths than radio frequency (RF) range communications, optical fibers may be used instead of metal wires because signals may travel along them with less loss and may also be immune to electromagnetic interference. Lasers are preferred light sources (although other light sources may also be used) in a majority of fiber-optic communication systems.

Optical fibers may include a transparent core surrounded by a transparent cladding material with a lower index of refraction. Light is kept in the core by total internal reflection causing the fiber to act as a waveguide. Fibers that support many propagation paths or transverse modes are often called multi-mode fibers, while those that support a single mode are often called single-mode fibers. Multi-mode fibers generally have a larger core diameter than single mode fibers, and thus multi-mode fibers may be used for short-distance communication links and for applications where high power may be transmitted.

From a fiber-type perspective, optical data communications can generally be categorized under two distinct approaches. One approach may include short-range, multi-mode, fiber-based solutions, which may provide a low cost solution for transmission of high bandwidth signals. Another approach may include long-range, single-mode, fiber-based solutions, which may result in a higher cost solution for transmission of signals. Some issues that may create the cost discrepancy may include a stringent alignment required by the single-mode fiber solutions, as well as the single-mode fibers being more suited to edge emitting lasers, which may be more expensive than vertical cavity lasers (VCSELs).

SUMMARY

The present disclosure generally describes techniques for modulation of a vertical cavity laser (VCSEL) for enhanced range of multi-modal fiber communication.

According to some example embodiments, various methods for phase modulating a Vertical Cavity Laser (VCSEL) may include one or more of applying a field across at least one reflector layer of the VCSEL to modify a refractive index of the at least one reflector layer, exciting the VCSEL, and/or phase-modulating a laser beam generated by the VCSEL by modifying a magnitude of the applied field.

According to other example embodiments, Vertical Cavity Laser (VCSEL) structures may include one or more of a bottom contact layer, a substrate layer deposited over the bottom contact layer, a lower reflector layer deposited over the substrate layer, an active layer deposited over the lower reflector layer, an upper reflector layer deposited over the active layer, and/or an isolating layer deposited at least partially over the upper reflector layer. The VCSEL structures may further include a top contact layer deposited over the isolating layer, where the VCSEL structure is configured to receive an applied field across at least one of the upper and the lower reflector layers, receive an excitation for generating a laser beam, and/or phase-modulate the generated laser beam based on a magnitude of the applied field.

According to further example embodiments, methods for forming a phase-modulated Vertical Cavity Laser (VCSEL) may include one or more of forming a bottom contact layer, depositing a substrate layer over the bottom contact layer, depositing a lower reflector layer over the substrate layer, depositing an active layer over the lower reflector layer, depositing an upper reflector layer over the active layer, and/or depositing an isolating layer at least partially over the upper reflector layer. The methods may also include depositing a top contact layer over the isolating layer, where the VCSEL is configured to receive an applied field across at least one of the upper and the lower reflector layers, receive an excitation for generating a laser beam, and/or phase-modulate the generated laser beam based on a magnitude of the applied field.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices, and/or computer program products related to modulation of a vertical cavity laser (VCSEL) for enhanced range of multi-modal fiber communication.

Briefly stated, technologies are described for enabling VCSELs to transmit phase or frequency modulated signals, which may have a substantially smaller transmission bandwidth and are more robust to transmission in a highly dispersive media such as multi-mode fibers. By applying an electric, magnetic, or electromagnetic field across one or more reflector layers of the VCSEL, a refractive index of the reflector layer(s) may be modified. The VCSEL may then be excited and the laser beam generated by the VCSEL phase-modulated by modifying a magnitude of the applied field.

Figure 1:
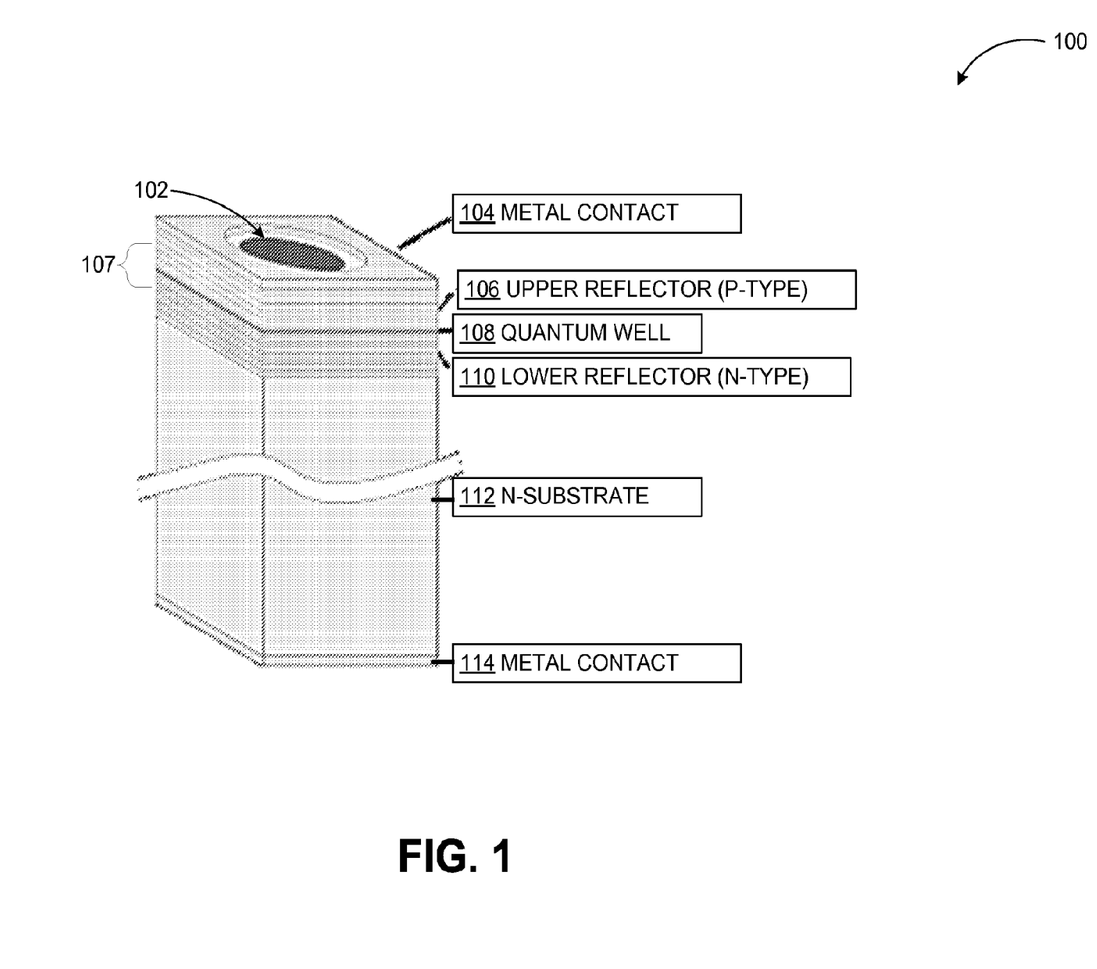
FIG. 1 illustrates a schematic illustration of an example Vertical Cavity Laser (VCSEL) structure.

FIG. 1 illustrates a schematic illustration of an example Vertical Cavity Laser (VCSEL) structure, arranged in accordance with at least some embodiments described herein.

As shown in diagram 100, an example VCSEL structure may include a top metal contact 104 and a bottom metal contact 114. Sandwiched between the top and bottom metal contacts 104 and 114 may be an n-substrate layer 112, a lower reflector layer (n-type) 110, a quantum well 108, and an upper reflector layer (p-type) 106 from bottom to top. The types of the substrate and reflector layers may be reversed in some embodiments depending on the material used. The upper metal contact 104 may also include an opening 102 for the transmission of generated laser light.

The vertical-cavity surface-emitting laser, or VCSEL, is a type of semiconductor laser diode with laser beam emission substantially perpendicular from the top surface, contrary to various edge-emitting semiconductor lasers (also in-plane lasers), which emit from surfaces formed by cleaving the individual chip out of a wafer. VCSEL production may have several advantages over edge-emitting laser production. For example, edge-emitters cannot be tested until the end of the production process. If an edge-emitter does not function properly, whether due to bad contacts or poor material growth quality, the production time and the processing materials utilized for the edge-emitting semi-conductor lasers may have been wasted. VCSELs, on the other hand, can be tested at several stages throughout the production process to check for material quality and processing issues.

Additionally, because the VCSELs emit the beam substantially perpendicular to the active region of the laser as opposed to parallel, as with an edge emitter, a large number (e.g., tens of thousands) of VCSELs may be processed simultaneously on a wafer. Furthermore, even though the VCSEL production process may be more labor- and material-intensive compared to edge-emitting semiconductor lasers, the yield for VCSEL production can be controlled more predictably than edge-emitters.

The upper and lower reflector layers 106 and 110 in a VCSEL may also be referred to as Bragg mirrors. Bragg mirrors may be created by a stack of alternating layers with a refractive index contrast. An optical active layer 107 may be created between the Bragg mirrors. The optical active layer 107 may be composed of quantum wells 108, a material composition and layer structure that can be designed to have a specific band gap. A current may be externally provided to the top metal contact 104. As mentioned above, the opening 102 in the top metal contact 104 permits light output. During operation, current flows towards from the top metal contact 104 toward the bottom metal contact 114. In the quantum well 108, the electrons and holes comprising the current may combine and light may be emitted.

Operational advantages of VCSELs over standard lasers may include their higher modulation bandwidth, smaller size, and lower cost relative to comparable laser types. In a standard operation, the VCSEL drive current amplitude may be modulated creating a corresponding modulation in the amount of light from the VCSEL. Some embodiments may be configured to directly to modulate a phase of the light emitted from the VCSEL. Phase modulation may be facilitated by changing the phase of the optical path in the cavity. For example, phase modulation may be accomplished using electro-optic modulation or piezo-electric modulation. In some example embodiments, an electric field may be applied across the VCSEL structure. The field may cause a change in the refractive index of the VCSEL cavity, which in turn may change a resonant frequency of the VCSEL and may cause a change in the frequency (or phase) of the output light.

Figure 2:
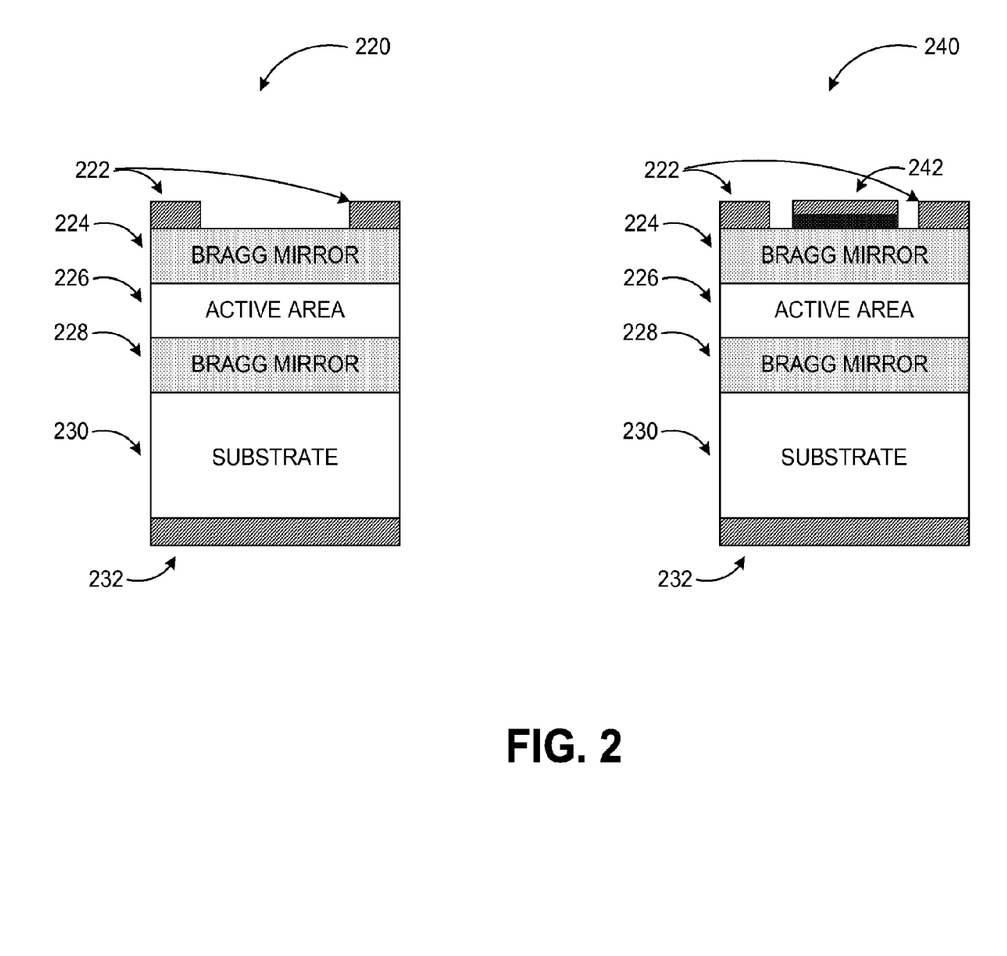
FIG. 2 illustrates a comparison between a conventional VCSEL structure and an example VCSEL structure according to some embodiments.

FIG. 2 illustrates a comparison between a conventional VCSEL structure and an example VCSEL structure, arranged in accordance with at least some embodiments described herein.

The example VCSEL structure in diagram 220 includes a bottom contact layer 232, a substrate 230, a lower reflector layer 228, an active area 226, an upper reflector layer 224, and a top contact layer 222 from bottom to top. In some example implementations, where the bottom and top contact layers are metal or similar non-transparent material, an opening may be provided at the top contact layer 222 to permit emission of generated laser light.

To enable electro-optic phase modulation, the resonance frequency of the laser cavity may be modified in some embodiments. To change the resonant frequency, a field may be applied across one or both of the Bragg mirrors modifying their center frequency. The shift in the center frequency may also cause a change in the phase of the reflected light and a subsequent change in the VCSEL frequency. The field may be electric, magnetic, or electromagnetic. While the term "electric field" used throughout the disclosure, it should be noted that a magnetic or electromagnetic field may also be used in place of the electric field using the principles described herein.

The layering of the VCSEL structure in diagram 240 is similar to that of the VCSEL structure in diagram 220. In the example structure of diagram 240, the electrode 242 for the electro-optical modulation may be located on top of the structure and may be made from a transparent conducting material such as Tin Oxide (TIO). In some embodiments, an isolated dielectric layer may be employed between the electrode 242 and the VCSEL structure (upper reflector layer 224). Also, the Bragg mirror or portion below the electrode 242 may be made less electrically conductive. An electric field may be created through the electrode 242. The electric field may not be used to drive excitement current through the VCSEL. The excitement current may be provided through the outer portions of the top contact layer 222. By applying a voltage to the electrode 242 in reference to the bottom contact layer 232 or, alternatively, in reference to a voltage at the active area 226, the electric field may be created in the top Bragg mirror (upper reflector layer 224).

The refractive index of the layers may change as a function of the electric field. A change in the refractive index of the layers may cause a change in the central frequency of the Bragg mirror and a change in the phase of the reflected light. As a result, the optical frequency of the laser may change in accordance with the applied voltage on the electrode 242, thus achieving phase or frequency modulation.

Figure 3:
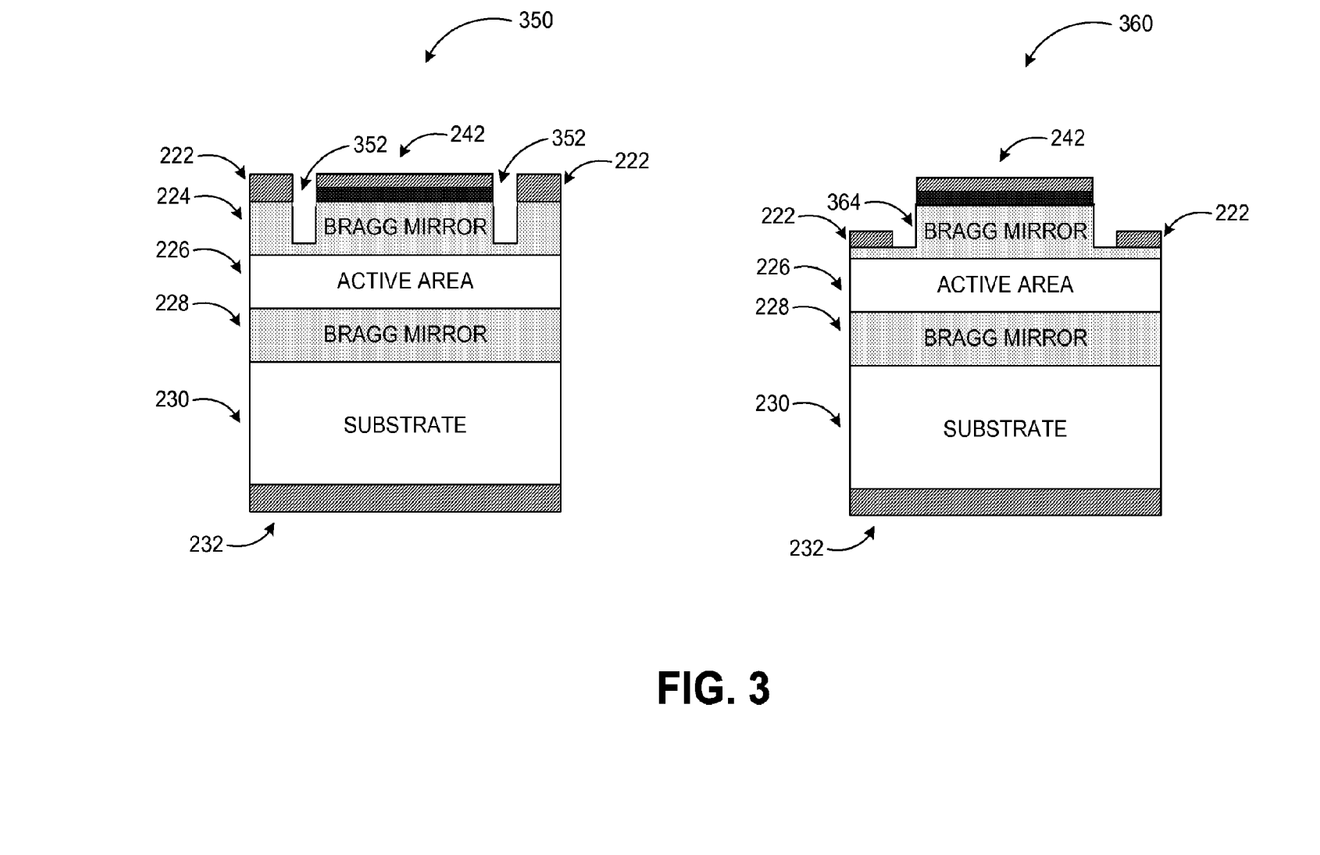
FIG. 3 illustrates two additional example VCSEL structures with isolation trenches and recessed electrical top contacts.

FIG. 3 illustrates two additional example VCSEL structures with isolation trenches and recessed electrical top contacts, arranged in accordance with at least some embodiments described herein.

Diagrams 350 and 360 illustrate two modified VCSEL structures according to some embodiments. The structure shown in diagram 350 includes bottom metal contact 232, substrate 230, lower reflector layer 228, active area 226, and upper reflector layer 224 from bottom to top. At the top of the sandwiched structure is the top contact layer 222. Differently, from the structure shown in FIG. 2, the structure in diagram 350 may include two isolation trenches 352 formed around the electrode 242 for providing a voltage to create the electric field. The same area may also be used for the opening to provide the emission of the generated laser light. The isolation trenches may direct the current away from the electric field.

The structure shown in diagram 360 includes the same layers as the structure of diagram 350. Differently from the structure in diagram 350, portions of the upper reflector layer 224 outside the trenches 364 are recessed in the structure of diagram 360. Portions of the top contact layer 222 may be lower relative to the top surface of the VCSEL structure covering the electrode 242 for providing the voltage to generate the electric field. In addition to directing the excitement current away from the electric field more efficiently, the recessed contact layer portions may enable easier electrical contact for the injection of the excitation current on a circuit board or similar configuration.

Figure 4:
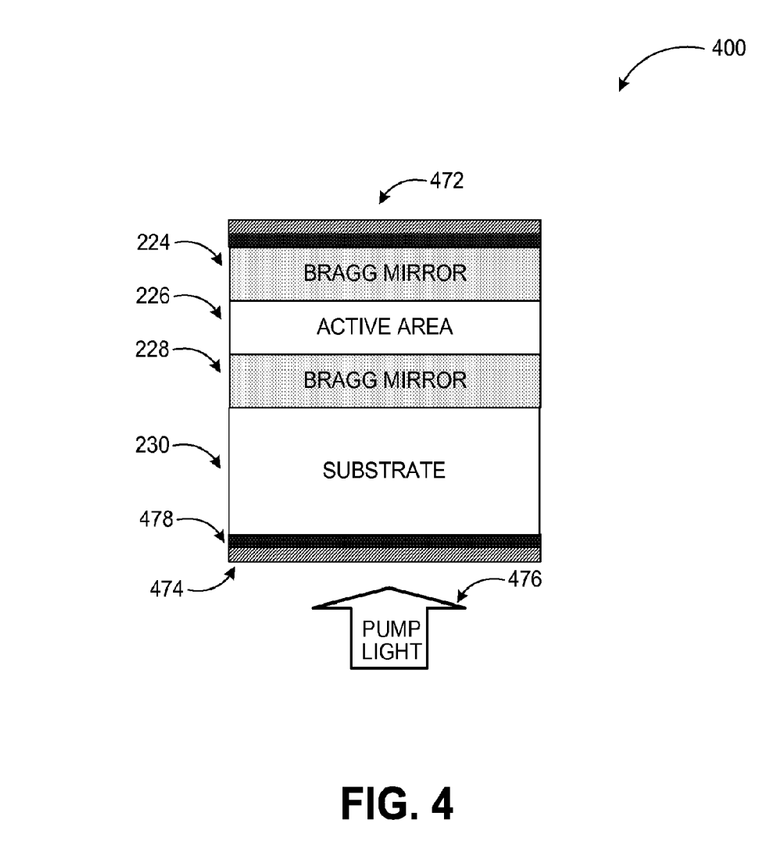
FIG. 4 illustrates a further example VCSEL structure employing optical beam excitement.

FIG. 4 illustrates a further example VCSEL structure employing optical beam excitement, arranged in accordance with at least some embodiments described herein.

Additional embodiments may be directed to more complex phase modulation structures on top of the top Bragg mirror or below the bottom Bragg mirror. The VCSEL structure shown in diagram 400 includes similar layers as discussed before such as substrate 230 with a lower reflector layer 228 (Bragg mirror), an active area 226 over the lower reflector layer 228, and an upper reflector layer 224 (Bragg mirror) over the active area 226. The top and bottom contact layers 472 and 474 may be made of transparent materials such as Indium Tin Oxide, Zinc Oxide, or even Carbon Nanotubes or Graphene. In some cases, a separate bottom electrode (transparent) 478 may also be provided for applying a voltage to generate the modulation field. In such a structure, light may be pumped (476) through the transparent bottom contact layer 474 exciting the VCSEL instead of injected current.

Further example structures may include an additional Bragg mirror made of, designated electro-optic material such as Lithium Niobate, electro-optic polymers, and similar materials. A width of each layer may also be selected based on desired performance, material type, and comparable factors.

Figure 5:
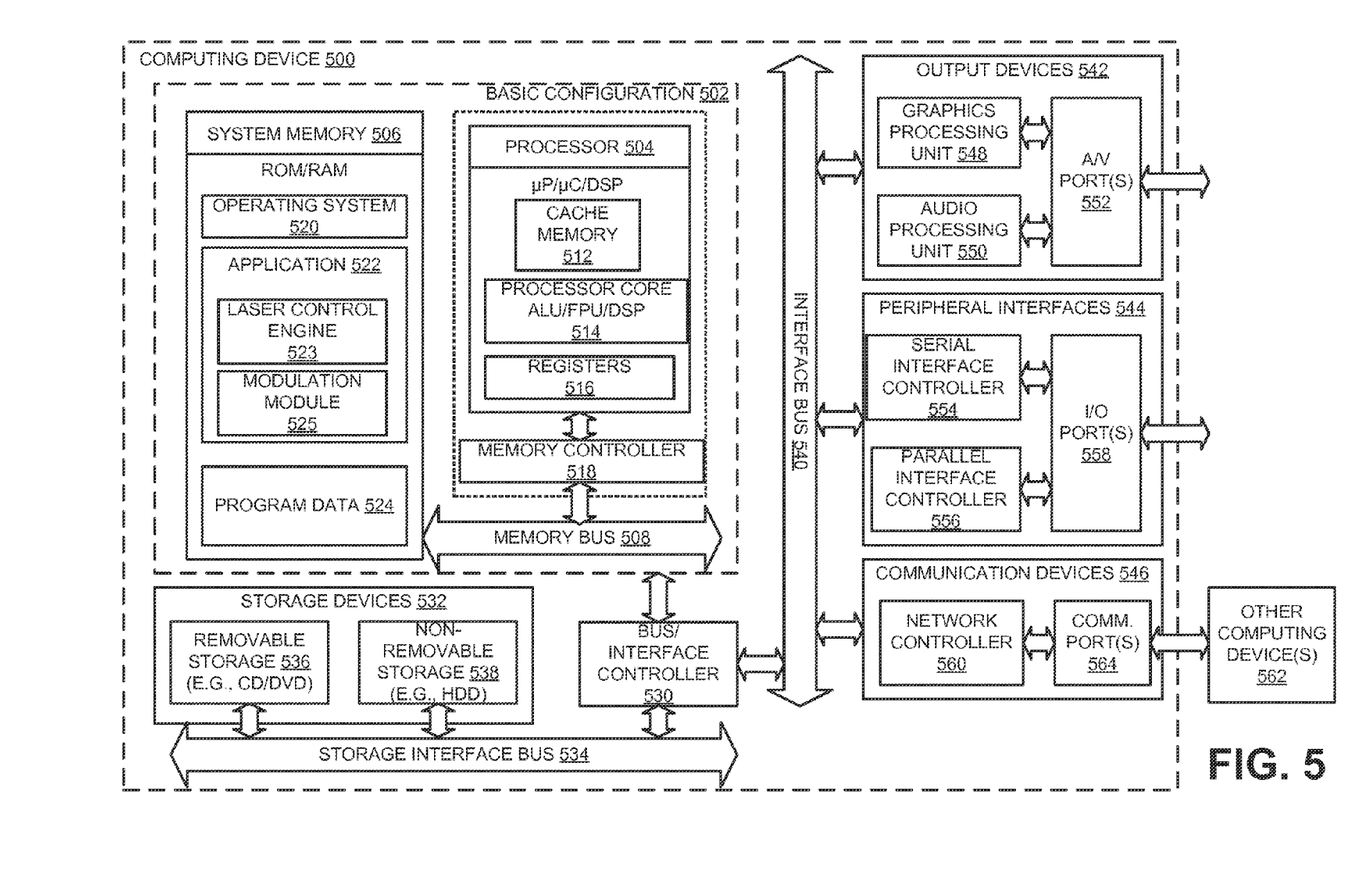
FIG. 5 a general purpose computing device, which may be used to implement a system for electro-optic phase modulation of a VCSEL circuit.

FIG. 5 illustrates a general purpose computing device, which may be used to implement a system for electro-optic phase modulation of a VCSEL circuit, arranged in accordance with at least some embodiments described herein. For example, computing device 500 may be used to control the VCSEL 400 of FIG. 4. In an example basic configuration 502, the computing device 500 may include one or more processors 504 and a system memory 506. A memory bus 508 may be used for communicating between the processor 504 and the system memory 506. The basic configuration 502 is illustrated in FIG. 5 by those components within the inner dashed line.

Depending on the desired configuration, the processor 504 may be of any type, including but not limited to a microprocessor (µP), a microcontroller (µC), a digital signal processor (DSP), or any combination thereof. The processor 504 may include one more levels of caching, such as a level cache memory 512, a processor core 514, and registers 516. The example processor core 514 may include an arithmetic logic unit (ALU), a floating point unit (FPU), a digital signal processing core (DSP Core), or any combination thereof. An example memory controller 518 may also be used with the processor 504, or in some implementations the memory controller 518 may be an internal part of the processor 504.

Depending on the desired configuration, the system memory 506 may be of any type including but not limited to volatile memory (such as RAM), non-volatile memory (such as ROM, flash memory, etc.) or any combination thereof. The system memory 506 may include an operating system 520, one or more applications 522, and program data 524. The applications 522 may be optical communication applications controlling one or more lasers in a fiber-optic communication system, and may include a laser control module 523 and a modulation module 525 controlling modulation of a VCSEL through an electric field applied to one or more reflector layers of the VCSEL as described herein. The program data 524 may include, among other data, control data for different electric field levels associated with different modulations, or the like, as described herein.

The computing device 500 may have additional features or functionality, and additional interfaces to facilitate communications between the basic configuration 502 and any desired devices and interfaces. For example, a bus/interface controller 530 may be used to facilitate communications between the basic configuration 502 and one or more data storage devices 532 via a storage interface bus 534. The data storage devices 532 may be one or more removable storage devices 536, one or more non-removable storage devices 538, or a combination thereof. Examples of the removable storage and the non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

The system memory 506, the removable storage devices 536 and the non-removable storage devices 538 are examples of computer storage media. Computer storage media includes, but is not limited to, RAM, ROM, EEPROM, flash memory or other memory technology, CD-ROM, digital versatile disks (DVD), solid state drives, or other optical storage, magnetic cassettes, magnetic tape, magnetic disk storage or other magnetic storage devices, or any other medium which may be used to store the desired information and which may be accessed by the computing device 500. Any such computer storage media may be part of the computing device 500.

The computing device 500 may also include an interface bus 540 for facilitating communication from various interface devices (e.g., one or more output devices 542, one or more peripheral interfaces 544, and one or more communication devices 546) to the basic configuration 502 via the bus/interface controller 530. Some of the example output devices 542 include a graphics processing unit 548 and an audio processing unit 550, which may be configured to communicate to various external devices such as a display or speakers via one or more A/V ports 552. One or more example peripheral interfaces 544 may include a serial interface controller 554 or a parallel interface controller 556, which may be configured to communicate with external devices such as input devices (e.g., keyboard, mouse, pen, voice input device, touch input device, etc.) or other peripheral devices (e.g., printer, scanner, etc.) via one or more I/O ports 558. An example communication device 546 includes a network controller 560, which may be arranged to facilitate communications with one or more other computing devices 562 over a network communication link via one or more communication ports 564. The one or more other computing devices 562 may include servers or similar devices in a fiber-optic communication system, or comparable devices.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 500 may be implemented as a part of a general purpose or specialized server, mainframe, or similar computer that includes any of the above functions. The computing device 500 may also be implemented as a personal computer including both laptop computer and non-laptop computer configurations.

Example embodiments may also include methods for modulating a VCSEL for enhanced range of multi-modal fiber communication. These methods can be implemented in any number of ways, including the structures described herein. One such way may be by machine operations, of devices of the type described in the present disclosure. Another optional way may be for one or more of the individual operations of the methods to be performed in conjunction with one or more human operators performing some of the operations while other operations may be performed by machines. These human operators need not be collocated with each other, but each can be separately with a machine that performs a portion of the program. In other examples, the human interaction can be automated such as by pre-selected criteria that may be machine automated.

Figure 6:
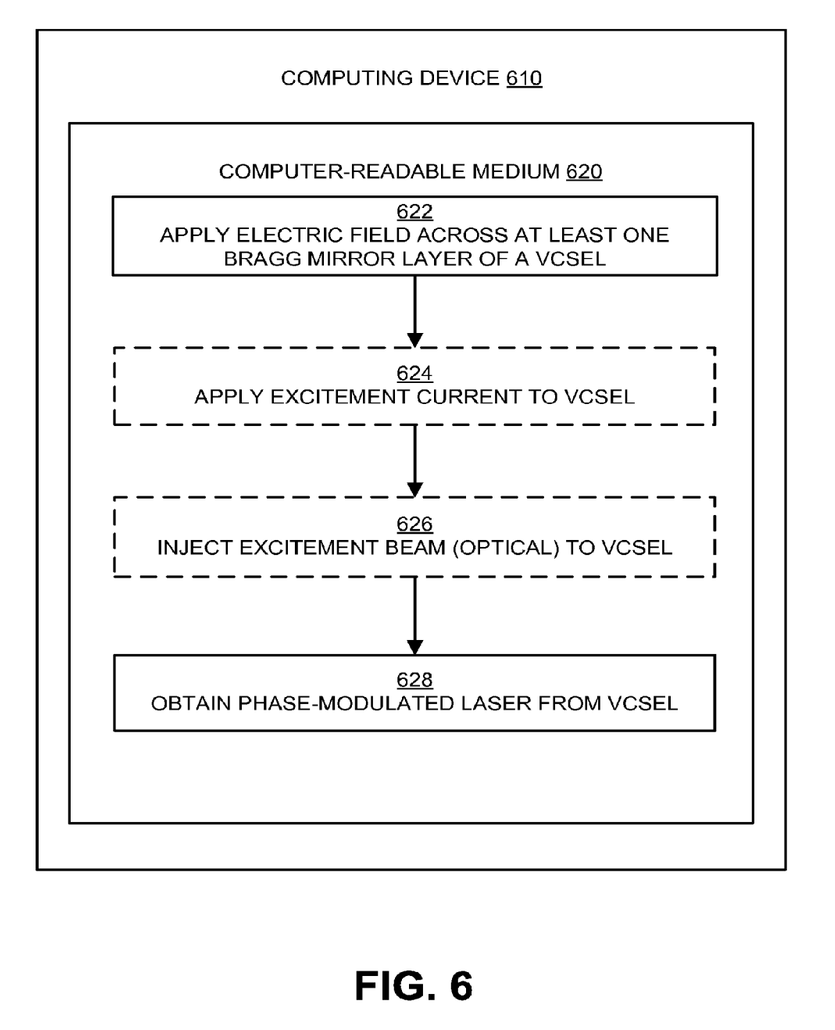
FIG. 6 is a flow diagram illustrating an example method for electro-optic phase modulation of a VCSEL circuit.

FIG. 6 is a flow diagram illustrating an example method for electro-optic phase modulation of a VCSEL circuit, arranged in accordance with at least some embodiments described herein. Example methods may include one or more operations, functions or actions as illustrated by one or more of blocks 622, 624, 626, and/or 628. The operations described in the blocks 622 through 628 may also be stored as computer-executable instructions in a computer-readable medium such as a computer-readable medium 620 of a computing device 610.

An example process for electro-optic phase modulation of a VCSEL circuit may begin with block 622, "APPLY ELECTRIC FIELD ACROSS AT LEAST ONE BRAGG MIRROR LAYER OF A VCSEL", where a voltage may be applied to an electrode 242 in reference to the bottom contact layer 232 or the active area 226 of the VCSEL structure of diagram 240 in FIG. 2. The applied electric field may cause a change in the refractive index of one or both reflector layers resulting in a frequency or phase modulation of the subsequently generated laser light. Block 622 may be followed by one of optional blocks 624 or 626. At optional block 624, "APPLY EXCITEMENT CURRENT TO VCSEL," excitement current may be injected through the top (or bottom) contact layer 222 (or 232) resulting in creation of laser light at the active area 226 of the VCSEL structure shown in diagram 240 of FIG. 2.

At optional block 626, "INJECT EXCITEMENT BEAM (OPTICAL) TO VCSEL," the VCSEL may be excited by injecting an optical beam 476 through the transparent bottom layer 474 as shown in diagram 400 of FIG. 4. The optical beam may cause excitement of the active area 226 generating laser light. At block 628, "OBTAIN PHASE-MODULATED LASER FROM VCSEL," following one of the optional blocks 624 and 626, phase or frequency modulated laser light may be obtained. The generated laser light may be modulated through the modification of the refractive index of the Bragg mirrors (reflector layers) and resulting change in cavity center frequency.

The blocks included in the above described process are for illustration purposes. Electro-optic phase modulation of a VCSEL circuit may be implemented by similar processes with fewer or additional blocks. In some examples, the blocks may be performed in a different order. In some other examples, various blocks may be eliminated. In still other examples, various blocks may be divided into additional blocks, or combined together into fewer blocks.

Figure 7:
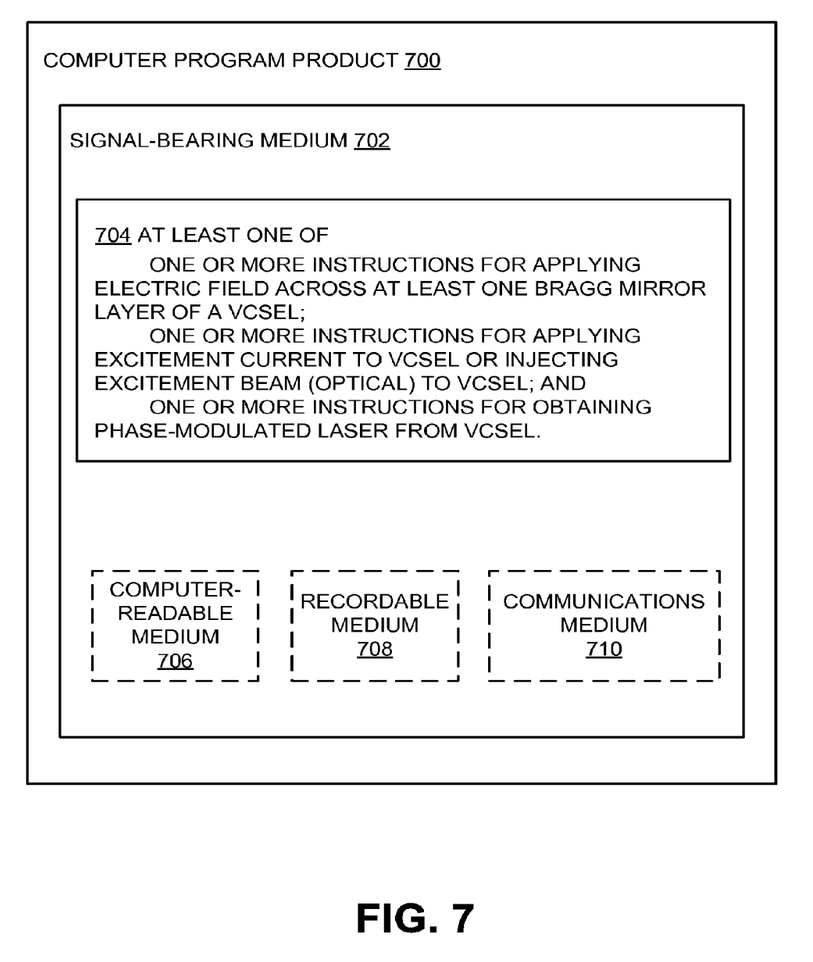
FIG. 7 illustrates a block diagram of an example computer program product, all arranged in accordance with at least some embodiments described herein.

FIG. 7 illustrates a block diagram of an example computer program product, arranged in accordance with at least some embodiments described herein. In some examples, as shown in FIG. 7, the computer program product 700 may include a signal bearing medium 702 that may also include one or more machine readable instructions 704 that, when executed by, for example, a processor, may provide the functionality described herein. Thus, for example, referring to the processor 504 in FIG. 5, the laser control engine 523 and/or the modulation module 525 may undertake one or more of the tasks shown in FIG. 7 in response to the instructions 704 conveyed to the processor 504 by the medium 702 to perform actions associated with electro-optically phase modulation of a VCSEL circuit as described herein. Some of those instructions may include, for example, instructions for applying electric field across at least one Bragg mirror layer of a VCSEL, applying excitement current to VCSEL or injecting excitement beam (optical) to VCSEL, and obtaining phase-modulated laser from VCSEL according to some embodiments described herein.

In some implementations, the signal bearing medium 702 depicted in FIG. 7 may encompass a computer-readable medium 706, such as, but not limited to, a hard disk drive, a solid state drive, a Compact Disc (CD), a Digital Versatile Disk (DVD), a digital tape, memory, etc. In some implementations, the signal bearing medium 702 may encompass a recordable medium 708, such as, but not limited to, memory, read/write (R/W) CDs, R/W DVDs, etc. In some implementations, the signal bearing medium 702 may encompass a communications medium 710, such as, but not limited to, a digital and/or an analog communication medium (e.g., a fiber optic cable, a waveguide, a wired communications link, a wireless communication link, etc.). Thus, for example, the program product 700 may be conveyed to one or more modules of the processor 504 by an RF signal bearing medium, where the signal bearing medium 702 is conveyed by the wireless communications medium 710 (e.g., a wireless communications medium conforming with the IEEE 802.11 standard).

According to some example embodiments, various methods for phase modulating a Vertical Cavity Laser (VCSEL) may include one or more of applying a field across at least one reflector layer of the VCSEL to modify a refractive index of the at least one reflector layer, exciting the VCSEL, and/or phase-modulating a laser beam generated by the VCSEL by modifying a magnitude of the applied field.

According to other examples, the VCSEL may include a bottom contact layer, a substrate layer deposited over the bottom contact layer, a lower reflector layer deposited over the substrate layer, an active layer deposited over the lower reflector layer, an upper reflector layer deposited over the active layer, an isolating layer deposited over the upper reflector layer, and a top contact layer deposited over the isolating layer. The field may be applied between the top contact layer and the bottom contact layer. The top contact layer may include at least one portion for transmitting the laser beam, and the at least one portion for transmitting the laser beam may be an opening or a transparent portion.

According to further examples, exciting the VCSEL comprises may include injecting an excitement current to the VCSEL between the top contact layer and the bottom contact layer and injecting an optical excitement beam into the VCSEL through the bottom contact layer. The bottom contact layer may be composed of a transparent material. The bottom contact layer may be composed of a Tin Oxide (TIO). The active area may be composed of quantum wells. The upper reflector layer and the lower reflector layer may be Bragg mirrors. The top contact layer, the isolation layer, and the upper reflector layer may include at least one isolation trench for directing an excitement current away from the applied field. The top contact layer may include at least one portion configured to receive an excitement current, the at least two portions being recessed into the upper reflector layer. The field may be electric, magnetic, or electromagnetic.

According to other example embodiments, Vertical Cavity Laser (VCSEL) structures may include one or more of a bottom contact layer, a substrate layer deposited over the bottom contact layer, a lower reflector layer deposited over the substrate layer, an active layer deposited over the lower reflector layer, an upper reflector layer deposited over the active layer, and/or an isolating layer deposited at least partially over the upper reflector layer. The VCSEL structures may further include a top contact layer deposited over the isolating layer, where the VCSEL structure is configured to receive an applied field across at least one of the upper and the lower reflector layers, receive an excitation for generating a laser beam, and/or phase-modulate the generated laser beam based on a magnitude of the applied field.

According to yet other examples, the VCSEL may include a bottom contact layer, a substrate layer deposited over the bottom contact layer, a lower reflector layer deposited over the substrate layer, an active layer deposited over the lower reflector layer, an upper reflector layer deposited over the active layer, an isolating layer deposited over the upper reflector layer, and a top contact layer deposited over the isolating layer. The field may be applied between the top contact layer and the bottom contact layer. The top contact layer may include at least one portion for transmitting the laser beam, and the at least one portion for transmitting the laser beam may be an opening or a transparent portion.

According to yet further examples, exciting the VCSEL comprises may include injecting an excitement current to the VCSEL between the top contact layer and the bottom contact layer and injecting an optical excitement beam into the VCSEL through the bottom contact layer. The bottom contact layer may be composed of a transparent material. The bottom contact layer may be composed of a Tin Oxide (TIO). The active area may be composed of quantum wells. The upper reflector layer and the lower reflector layer may be Bragg mirrors. The top contact layer, the isolation layer, and the upper reflector layer may include at least one isolation trench for directing an excitement current away from the applied field. The top contact layer may include at least one portion configured to receive an excitement current, the at least two portions being recessed into the upper reflector layer. The field may be electric, magnetic, or electromagnetic.

According to further example embodiments, methods for forming a phase-modulated Vertical Cavity Laser (VCSEL) may include one or more of forming a bottom contact layer, depositing a substrate layer over the bottom contact layer, depositing a lower reflector layer over the substrate layer, depositing an active layer over the lower reflector layer, depositing an upper reflector layer over the active layer, and/or depositing an isolating layer at least partially over the upper reflector layer. The methods may also include depositing a top contact layer over the isolating layer, where the VCSEL is configured to receive an applied field across at least one of the upper and the lower reflector layers, receive an excitation for generating a laser beam, and/or phase-modulate the generated laser beam based on a magnitude of the applied field.

According to some examples, the VCSEL may include a bottom contact layer, a substrate layer deposited over the bottom contact layer, a lower reflector layer deposited over the substrate layer, an active layer deposited over the lower reflector layer, an upper reflector layer deposited over the active layer, an isolating layer deposited over the upper reflector layer, and a top contact layer deposited over the isolating layer. The field may be applied between the top contact layer and the bottom contact layer. The top contact layer may include at least one portion for transmitting the laser beam, and the at least one portion for transmitting the laser beam may be an opening or a transparent portion.

According to other examples, exciting the VCSEL comprises may include injecting an excitement current to the VCSEL between the top contact layer and the bottom contact layer and injecting an optical excitement beam into the VCSEL through the bottom contact layer. The bottom contact layer may be composed of a transparent material. The bottom contact layer may be composed of a Tin Oxide (TIO). The active area may be composed of quantum wells. The upper reflector layer and the lower reflector layer may be Bragg mirrors. The top contact layer, the isolation layer, and the upper reflector layer may include at least one isolation trench for directing an excitement current away from the applied field. The top contact layer may include at least one portion configured to receive an excitement current, the at least two portions being recessed into the upper reflector layer. The field may be electric, magnetic, or electromagnetic.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g. as one or more programs running on one or more microprocessors), as firmware, or as virtually any combination thereof, and that designing the circuitry and/or writing the code for the software and/or firmware would be well within the skill of one of skill in the art in light of this disclosure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, a solid state drive, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity of gantry systems; control motors for moving and/or adjusting components and/or quantities).

A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method to phase modulate a vertical cavity laser (VCSEL), the method comprising:
   applying a field across at least one reflector layer of the VCSEL to modify a refractive index of the at least one reflector layer;
   exciting the VCSEL by injecting an optical excitement beam into the VCSEL through a bottom contact layer, wherein the bottom contact layer is composed of a transparent material; and
   phase-modulating a laser beam generated by the VCSEL by modifying a magnitude of the applied field.

2. The method according to claim 1, wherein exciting the VCSEL includes exciting the VCSEL that includes the bottom contact layer, a substrate layer deposited over the bottom contact layer, a lower reflector layer deposited over the substrate layer, an active layer deposited over the lower reflector layer, an upper reflector layer deposited over the active layer, an isolation layer deposited over the upper reflector layer, and a top contact layer deposited over the isolation layer.

3. The method according to claim 2, wherein applying the field includes applying the field between the top contact layer and the bottom contact layer.

4. The method according to claim 2, wherein exciting the VCSEL further comprises:
   injecting an excitement current to the VCSEL between the top contact layer and the bottom contact layer.

5. The method according to claim 2, wherein the top contact layer, the isolation layer, and the upper reflector layer include at least one isolation trench, the method further comprising directing an excitement current away from the applied field using the at least one isolation trench.

6. The method according to claim 2, further comprising receiving an excitement current with at least one portion of the top contact layer, the at least one portion being recessed into the upper reflector layer.

7. The method according to claim 1, wherein applying the field includes applying a field that is one of electric, magnetic, and electromagnetic.

8. A vertical cavity laser (VCSEL) structure, comprising:
   a bottom contact layer;
   a substrate layer deposited over the bottom contact layer;
   a lower reflector layer deposited over the substrate layer;
   an active layer deposited over the lower reflector layer;
   an upper reflector layer deposited over the active layer;
   an isolation layer deposited at least partially over the upper reflector layer; and
   a top contact layer deposited over the isolation layer, wherein the VCSEL structure is configured to receive an applied field across at least one of the upper and the lower reflector layer, receive an excitation to generate a laser beam through injection of an optical excitement beam through the bottom contact layer, and phase-modulate the generated laser beam based on a magnitude of the applied field.

9. The VCSEL structure according to claim 8, wherein the field is applied between the top contact layer and the bottom contact layer.

10. The VCSEL structure according to claim 8, wherein the top contact layer includes at least one portion to transmit the laser beam.

11. The VCSEL structure according to claim 10, wherein the at least one portion to transmit the laser beam includes one of an opening portion and a transparent portion.

12. The VCSEL structure according to claim 8, wherein the VCSEL is further configured to be excited through:
   injection of an excitement current between the top contact layer and the bottom contact layer.

13. The VCSEL structure according to claim 12, wherein the bottom contact layer is composed of a transparent material.

14. The VCSEL structure according to claim 12, wherein the bottom contact layer is composed of a tin oxide (TIO).

15. The VCSEL structure according to claim 8, wherein the active layer is composed of quantum wells.

16. The VCSEL structure according to claim 8, wherein the upper reflector layer and the lower reflector layer include Bragg mirrors.

17. The VCSEL structure according to claim 8, wherein the top contact layer, the isolation layer, and the upper reflector layer include at least one isolation trench to direct an excitement current away from the applied field.

18. The VCSEL structure according to claim 8, wherein the top contact layer includes at least one portion configured to receive an excitement current, the at least one portion being recessed into the upper reflector layer.

19. The VCSEL structure according to claim 8, wherein the field is one of electric, magnetic, and electromagnetic.

20. A method to form a phase-modulated vertical cavity laser (VCSEL), the method comprising:
   forming a bottom contact layer;
   forming a substrate layer over the bottom contact layer;
   forming a lower reflector layer over the substrate layer;
   forming an active layer over the lower reflector layer;
   forming an upper reflector layer over the active layer;
   forming an isolation layer at least partially over the upper reflector layer; and
   forming a top contact layer over the isolation layer, wherein the VCSEL is configured to receive an applied field across at least one of the upper and the lower reflector layer, receive an excitation to generate a laser beam through injection of an optical excitement beam through the bottom contact layer, and phase-modulate the generated laser beam based on a magnitude of the applied field.

21. The method according to claim 20, wherein forming the active layer includes forming an active layer that is composed of quantum wells.

22. The method according to claim 2, wherein the top contact layer includes at least one portion, the method further comprising transmitting the laser beam using the at least one portion.

23. The method according to claim 22, wherein transmitting laser beam using the at least one portion includes transmitting the laser beam by using one of an opening and a transparent portion.

24. The method according to claim 20, wherein forming the top contact layer includes forming at least one portion to transmit the laser beam.

25. The method according to claim 24, wherein forming the at least one portion to transmit the laser beam includes forming one of an opening and a transparent portion.

26. The method according to claim 20, wherein forming the bottom contact layer includes forming a bottom layer composed of a transparent material.

27. The method according to claim 20, wherein forming the top contact layer, the isolation layer, and the upper reflector layer include forming at least one isolation trench to direct an excitement current away from the applied field.

28. The method according to claim 20, wherein forming the top contact layer includes forming at least one portion configured to receive an excitement current and at least two portions are recessed into the upper reflector layer.

* * * * *

UNITED STATES PATENT AND TRADEMARK OFFICE
CERTIFICATE OF CORRECTION

PATENT NO. : 9,077,149 B2
APPLICATION NO. : 13/977482
DATED : July 7, 2015
INVENTOR(S) : Margalit Page 1 of 1

It is certified that error appears in the above-identified patent and that said Letters Patent is hereby corrected as shown below:

On the title page

Item (72), delete "Zichron Yagov" and insert -- Zichron Yaaqov --, therefor.

On Page 2, Item (56), under "OTHER PUBLICATIONS", Column 2, Lines 4-5, delete "PCT/US2012/071866" and insert -- PCT/US2012/071868 --, therefor.

In the specification

Column 1, Lines 6-7, delete "35 U.S.C. §371" and insert -- 35 U.S.C. § 371 --, therefor.

Signed and Sealed this
Twenty-second Day of December, 2015

Michelle K. Lee
*Director of the United States Patent and Trademark Office*